(12) United States Patent
Koh et al.

(10) Patent No.: US 9,431,512 B2
(45) Date of Patent: Aug. 30, 2016

(54) METHODS OF FORMING NANOWIRE DEVICES WITH SPACERS AND THE RESULTING DEVICES

(71) Applicant: GLOBALFOUNDRIES Inc., Grand Cayman (KY)

(72) Inventors: Shao-Ming Koh, Clifton Park, NY (US); Guillaume Bouche, Albany, NY (US); Jing Wan, Malta, NY (US); Andy C. Wei, Queensbury, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 31 days.

(21) Appl. No.: 14/308,257

(22) Filed: Jun. 18, 2014

(65) Prior Publication Data

US 2015/0372111 A1     Dec. 24, 2015

(51) Int. Cl.
*H01L 21/336* (2006.01)
*H01L 29/66* (2006.01)
(Continued)

(52) U.S. Cl.
CPC ......... *H01L 29/66439* (2013.01); *B82Y 10/00* (2013.01); *B82Y 40/00* (2013.01); *H01L 29/0673* (2013.01); *H01L 29/6653* (2013.01); H01L 29/66575 (2013.01); *H01L 29/66636* (2013.01); *H01L 29/775* (2013.01)

(58) Field of Classification Search
CPC ............. H01L 29/775; H01L 29/0673; H01L 29/66439; H01L 29/78696; H01L 29/0669; H01L 29/66545; H01L 29/0676; H01L 29/0665; H01L 29/1054; H01L 29/6656; H01L 29/66628; H01L 21/02532; H01L 21/02603; H01L 21/832412; H01L 21/02507; H01L 21/02104; H01L 21/3086; H01L 21/308; H01L 27/0629; H01L 21/0245; H01L 21/02502; H01L 21/02505; H01L 29/6653; H01L 29/66575; H01L 29/66636; Y10S 977/762; Y10S 977/938; Y10S 977/888; Y10S 977/84; B82Y 40/00; B82Y 10/00
See application file for complete search history.

(56) References Cited

U.S. PATENT DOCUMENTS 6,432,754 B1 * 8/2002 Assaderaghi ..... H01L 29/41733
                                                            257/347
7,235,436 B1    6/2007 Lin et al.
(Continued)

OTHER PUBLICATIONS

Ang et al., "Effective Schottky Barrier Height Modulation using Dielectric Dipoles for Source/Drain Specific Contact Resistivity Improvement," IEDM12-439-442, 18.6.1-18.6.4, 2012.
(Continued)

*Primary Examiner* — Brett Feeney
*Assistant Examiner* — Sophia Nguyen
(74) *Attorney, Agent, or Firm* — Amerson Law Firm, PLLC

(57) ABSTRACT

A method of forming a nanowire device includes forming semiconductor material layers above a semiconductor substrate, forming a gate structure above the semiconductor material layers, forming a first sidewall spacer adjacent to the gate structure and forming a second sidewall spacer adjacent to the first sidewall spacer. The method further includes patterning the semiconductor material layers such that each layer has first and second exposed end surfaces. The gate structure, the first sidewall spacer, and the second sidewall spacer are used in combination as an etch mask during the patterning process. The method further includes removing the first and second sidewall spacers, thereby exposing at least a portion of the patterned semiconductor material layers. The method further includes forming doped extension regions in at least the exposed portions of the patterned semiconductor material layers after removing the first and second sidewall spacers.

19 Claims, 15 Drawing Sheets

(51) Int. Cl.
  *B82Y 10/00*  (2011.01)
  *B82Y 40/00*  (2011.01)
  *H01L 29/775*  (2006.01)
  *H01L 29/06*  (2006.01)

(56) References Cited

U.S. PATENT DOCUMENTS

| | | | | |
|---|---|---|---|---|
| 7,781,800 B2* | 8/2010 | Chen | H01L 27/1203 | 257/190 |
| 7,981,736 B2 | 7/2011 | Juengling | | |
| 8,034,689 B2 | 10/2011 | Lenoble et al. | | |
| 8,076,231 B2 | 12/2011 | Saitoh et al. | | |
| 8,159,018 B2 | 4/2012 | Akil et al. | | |
| 8,541,274 B1 | 9/2013 | Xie et al. | | |
| 8,728,885 B1* | 5/2014 | Pham | H01L 29/0673 | 257/E21.623 |
| 9,171,843 B2* | 10/2015 | Ching | H01L 27/092 | |
| 2004/0197977 A1 | 10/2004 | Deleonibus | H01L 29/66772 | 438/202 |
| 2005/0093021 A1* | 5/2005 | Ouyang | H01L 21/823807 | 257/194 |
| 2005/0112851 A1* | 5/2005 | Lee | H01L 29/7831 | 438/497 |
| 2005/0118769 A1* | 6/2005 | Kammler | H01L 21/02164 | 438/303 |
| 2005/0282318 A1 | 12/2005 | Dao | | |
| 2006/0024874 A1* | 2/2006 | Yun | H01L 29/42392 | 438/197 |
| 2006/0065914 A1* | 3/2006 | Chen | H01L 21/26506 | 257/288 |
| 2006/0240622 A1* | 10/2006 | Lee | H01L 29/42392 | 438/257 |
| 2007/0020866 A1* | 1/2007 | Cheng | H01L 21/823814 | 438/301 |
| 2007/0196973 A1* | 8/2007 | Park | H01L 21/823412 | 438/197 |
| 2007/0264765 A1* | 11/2007 | Lan | H01L 21/823814 | 438/199 |
| 2008/0076214 A1* | 3/2008 | Han | H01L 21/28123 | 438/197 |
| 2009/0108292 A1* | 4/2009 | Liu | H01L 27/10802 | 257/190 |
| 2009/0242964 A1 | 10/2009 | Akil et al. | | |
| 2009/0294839 A1 | 12/2009 | Doyle et al. | | |
| 2010/0155827 A1* | 6/2010 | Kim | H01L 29/42392 | 257/327 |
| 2010/0164102 A1 | 7/2010 | Rachmady et al. | | |
| 2010/0295021 A1* | 11/2010 | Chang | H01L 27/1203 | 257/24 |
| 2010/0295022 A1* | 11/2010 | Chang | B82Y 10/00 | 257/24 |
| 2010/0297836 A1* | 11/2010 | Sasaki | H01J 37/32412 | 438/513 |
| 2011/0012201 A1 | 1/2011 | Yagishita et al. | | |
| 2011/0065266 A1* | 3/2011 | Sasaki | H01J 37/32412 | 438/513 |
| 2011/0084336 A1 | 4/2011 | Luning et al. | | |
| 2011/0097881 A1 | 4/2011 | Vandervorst et al. | | |
| 2011/0127583 A1* | 6/2011 | Uhlig | G01R 33/07 | 257/252 |
| 2011/0127617 A1* | 6/2011 | Scheiper | H01L 21/26586 | 257/402 |
| 2011/0147697 A1 | 6/2011 | Shah et al. | | |
| 2011/0230027 A1* | 9/2011 | Kim | H01L 21/26586 | 438/285 |
| 2011/0233522 A1 | 9/2011 | Cohen et al. | | |
| 2011/0309333 A1* | 12/2011 | Cheng | B82Y 10/00 | 257/24 |
| 2012/0012932 A1* | 1/2012 | Perng | H01L 29/165 | 257/347 |
| 2012/0012939 A1* | 1/2012 | Wenwu | H01L 21/823842 | 257/369 |
| 2012/0037994 A1 | 2/2012 | Saitoh et al. | | |
| 2012/0126338 A1 | 5/2012 | Juengling | | |
| 2012/0129354 A1* | 5/2012 | Luong | H01L 21/6831 | 438/714 |
| 2012/0138886 A1* | 6/2012 | Kuhn | B82Y 10/00 | 257/9 |
| 2012/0261643 A1 | 10/2012 | Cohen et al. | | |
| 2012/0280251 A1* | 11/2012 | Dube | H01L 29/66628 | 257/77 |
| 2012/0280292 A1* | 11/2012 | Bjoerk | B82Y 10/00 | 257/288 |
| 2012/0282743 A1* | 11/2012 | Saitoh | H01L 21/845 | 438/152 |
| 2012/0309173 A1 | 12/2012 | Shah et al. | | |
| 2012/0319178 A1* | 12/2012 | Chang | B82Y 10/00 | 257/287 |
| 2013/0020707 A1 | 1/2013 | Or-Bach et al. | | |
| 2013/0065371 A1 | 3/2013 | Wei et al. | | |
| 2013/0175503 A1* | 7/2013 | Cohen | H01L 29/66439 | 257/29 |
| 2013/0285123 A1* | 10/2013 | Adam | H01L 21/30608 | 257/255 |
| 2013/0307513 A1* | 11/2013 | Then | H01L 29/66469 | 323/311 |
| 2013/0320455 A1* | 12/2013 | Cappellani | H01L 29/66795 | 257/368 |
| 2014/0001441 A1* | 1/2014 | Kim | H01L 29/0673 | 257/29 |
| 2014/0054679 A1* | 2/2014 | Tang | H01L 29/785 | 257/329 |
| 2014/0097487 A1* | 4/2014 | Yen | H01L 29/66803 | 257/327 |
| 2014/0138745 A1* | 5/2014 | Shin | H01L 29/4966 | 257/192 |
| 2014/0139257 A1* | 5/2014 | Kang | G01R 31/2648 | 324/762.01 |
| 2014/0151757 A1* | 6/2014 | Basu | B82Y 40/00 | 257/288 |
| 2014/0225065 A1* | 8/2014 | Rachmady | H01L 29/42392 | 257/24 |
| 2014/0252501 A1* | 9/2014 | Cheng | H01L 29/7834 | 257/408 |
| 2014/0264253 A1* | 9/2014 | Kim | H01L 29/0673 | 257/9 |
| 2015/0008488 A1* | 1/2015 | Hall | H01L 29/66636 | 257/288 |
| 2015/0021683 A1* | 1/2015 | Xie | H01L 29/6653 | 257/330 |
| 2015/0090958 A1* | 4/2015 | Yang | H01L 29/0676 | 257/27 |
| 2015/0162329 A1* | 6/2015 | Chuang | H01L 27/088 | 257/368 |
| 2015/0287826 A1* | 10/2015 | Cheng | H01L 29/7848 | 257/20 |
| 2015/0311212 A1* | 10/2015 | Ching | H01L 21/02532 | 257/192 |
| 2015/0340457 A1* | 11/2015 | Xie | H01L 29/66545 | 257/288 |
| 2015/0372115 A1* | 12/2015 | Koh | H01L 29/6656 | 438/301 |
| 2016/0111513 A1* | 4/2016 | Liu | H01L 29/42392 | 438/163 |

OTHER PUBLICATIONS

Hur et al., "A Practical Si Nanowire Technology with Nanowire-on-Insulator structure for beyond 10nm Logic Technologies," IEDM13-649-652, 26.5.1-26.5.4, 2013.

Kuhn, "Peering into Moore's Crystal Ball: Transistor Scaling beyond the 15nm node," Int'l Symp. on Adv. Gate Stack Technology, Sep. 29, 2010.

Moon et al., "Investigation of Silicon Nanowire Gate-All-Around Junctionless Transistors Built on a Bulk Substrate," IEEE Transactions on Electron Devices, 60:1355-60, Apr. 2013.

Office Action from related U.S. Appl. No. 14/308,138 dated Jan. 21, 2016.

* cited by examiner

METHODS OF FORMING NANOWIRE DEVICES WITH SPACERS AND THE RESULTING DEVICES

BACKGROUND OF THE INVENTION

1. Field of the Disclosure

The present disclosure generally relates to the formation of semiconductor devices, and, more specifically, to various methods of forming nanowire devices with spacer regions and the resulting devices.

2. Description of the Related Art

The fabrication of advanced integrated circuits, such as CPUs (central processing units), storage devices, ASICs (application specific integrated circuits) and the like, requires the formation of a large number of circuit elements in a given chip area according to a specified circuit layout, wherein so-called metal oxide semiconductor field effect transistors (MOSFETs or FETs) represent one important element that substantially determines performance of the integrated circuits. A FET is a planar device that typically includes a source region, a drain region, a channel region that is positioned between the source region and the drain region, and a gate structure positioned above the channel region. These elements are sometimes referred to as the source, drain, channel, and gate, respectively. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and prevent the channel from being adversely affected by the electrical potential of the drain. This is sometimes referred to as a short channel effect, wherein the characteristic of the FET as an active switch is degraded.

In contrast to a FET, which has a planar structure, there are so-called 3D devices, such as an illustrative FinFET device, which is a three-dimensional structure. More specifically, in a FinFET, a generally vertically positioned fin-shaped active area is formed, and a gate electrode encloses both sides and an upper surface of the fin-shaped active area to form a tri-gate structure so as to use a channel having a three-dimensional structure instead of a planar structure. In some cases, an insulating cap layer, e.g. silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device.

Another form of 3D semiconductor device employs so-called nanowire structures for the channel region of the device. There are several known techniques for forming such nanowire structures. As the name implies, at the completion of the fabrication process, the nanowire structures typically have a generally circular cross-sectional configuration. Nanowire devices are considered to be one option for solving the constant and continuous demand for semiconductor devices with smaller feature sizes. However, the manufacture of nanowire devices is a very complex process.

FIG. 1 is a simplified view of an illustrative nanowire device 100 at an early stage of manufacturing that is formed on a semiconducting substrate 10. FIG. 1 is provided so as to explain one example of how nanowire devices may be fabricated. At the point of fabrication depicted in FIG. 1, various layers of semiconducting material 11, 12, 13 and 14 were formed above the substrate 10. In general, in the depicted example, the layers 11 and 13 include a semiconductor material that may be selectively removed or etched relative to the materials used for the semiconducting material layers 12 and 14. As described more fully below, portions of the semiconductor material layers 11 and 13 will be removed while the semiconducting material layers 12 and 14 will be left in place. Thus, the portions of the semiconducting material layers 11 and 13 within the channel region of the device are sacrificial in nature. The semiconductor materials 11, 12, 13 and 14 may include a variety of different materials such as, for example, silicon, doped silicon, silicon-carbon, silicon-germanium, a III-V material, germanium, etc., and they may be formed to any desired thickness by performing any appropriate process, e.g., an epitaxial growth process, deposition plus ion implantation, etc. In one embodiment, the semiconducting material layers 11 and 13 may be made from silicon-germanium, while the semiconducting material layers 12 and 14 may be made from silicon.

The gate structure 25 may include a variety of different materials and a variety of configurations. As shown, the gate structure 25 includes a gate insulation layer 25A, a gate electrode 25B, and a gate cap layer 25C. A deposition or thermal growth process may be performed to form the gate insulation layer 25A, which may be made of silicon dioxide in one embodiment. Thereafter, the materials for the gate electrode 25B and the gate cap layer 25C may be deposited above the device 100, and the layers may be patterned by performing photolithographic and etching techniques. The gate electrode 25B may include a variety of materials, such as polysilicon or amorphous silicon.

When the device 100 is completed, there will be two illustrative nanowires in the nanowire channel structure that will be arranged in the form of a vertical stack, where one nanowire is positioned above the other nanowire. To reduce parasitic resistance, the regions between the spacers may be doped. Each of the nanowires may be equally doped to reduce device performance variability. However, each nanowire will not have the same characteristics when formed by performing known techniques. Specifically, performing known doping techniques results in the nanowires having different "dopant profiles." A dopant profile of a nanowire is defined by the location, concentration and type of dopant within the nanowire. Thus, two nanowires with the same dopant profiles are doped with substantially the same types of dopants, in substantially the same concentration, and at substantially the same locations within the nanowires. Ideally, all of the nanowires in a device should have substantially the same dopant profile. Nanowires with different dopant profiles result in devices with uneven performance, reliability and unpredictable costs for testing.

To reduce production cost and increase circuit functionality, the semiconductor industry strives to increase the number of transistors and their speed or performance within an integrated circuit. The present disclosure is directed to various methods of forming nanowire devices with spacers and the resulting devices to realize such gains. Additionally, the methods and devices disclosed herein reduce or eliminate one or more of the problems identified above.

SUMMARY

The following presents a simplified summary of the disclosure in order to provide a basic understanding of some aspects of the disclosure. This summary is not an exhaustive overview. Its sole purpose is to present some concepts in a simplified form as a prelude to the more detailed description that is discussed later.

Generally, the present disclosure is directed to devices and methods of forming nanowire devices with spacers and the resulting devices. One illustrative method of forming a nanowire device disclosed herein includes forming semiconductor material layers above a semiconductor substrate. The method further includes forming a gate structure above the semiconductor material layers. The method further includes forming a first sidewall spacer adjacent to the gate structure and forming a second sidewall spacer adjacent to the first sidewall spacer. The method further includes patterning the semiconductor material layers such that each layer has first and second exposed end surfaces. The gate structure, the first sidewall spacer, and the second sidewall spacer are used in combination as an etch mask during the patterning process. The method further includes removing the first and second sidewall spacers, thereby exposing at least a portion of the patterned semiconductor material layers. The method further includes forming doped extension regions in at least the exposed portions of the patterned semiconductor material layers after removing the first and second sidewall spacers.

Another illustrative method of forming a nanowire device includes forming a first sidewall spacer adjacent to a gate structure and forming a second sidewall spacer adjacent to the first sidewall spacer. The method further includes patterning semiconductor material layers such that each layer has first and second exposed end surfaces. The gate structure, the first sidewall spacer and the second sidewall spacer are used in combination as an etch mask during the patterning process. The method further includes exposing at least a portion of the patterned semiconductor material layers and forming doped extension regions in at least the exposed portions of the patterned semiconductor material layers.

An illustrative device disclosed herein includes a gate structure and a nanowire channel structure positioned under the gate structure. The nanowire channel structure includes first and second end portions. The device further includes a continuous portion of spacer material adjacent to the gate structure and the first and second end portions.

BRIEF DESCRIPTION OF THE DRAWINGS

The disclosure may be understood by reference to the following description taken in conjunction with the accompanying drawings, in which like reference numerals identify like elements, and in which.

Figure 1:
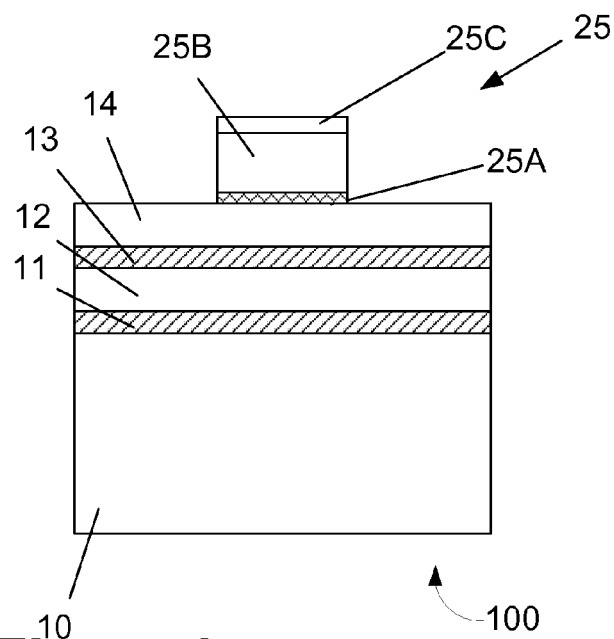
FIG. 1 depicts a cross-sectional view of an illustrative prior art nanowire device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

NOTATION AND NOMENCLATURE

Certain terms are used throughout the disclosure to refer to particular components. However, different entities may refer to a component by different names. This document does not intend to distinguish between components that differ in name but not function. The terms "including" and "comprising" are used herein an open-ended fashion, and thus mean "including, but not limited to."

DETAILED DESCRIPTION

The present subject matter will now be described with reference to the attached figures. Various structures, systems, and devices are schematically depicted in the drawings for purposes of explanation only. The attached drawings are included to describe and explain illustrative examples of the present disclosure. The words and phrases used herein should be understood and interpreted to have a meaning consistent with the understanding of those words and phrases by those in the industry. No special definition of a term or phrase, i.e., a definition that is different from the ordinary and customary meaning as understood by those in the industry, is intended to be implied by consistent usage of the term or phrase herein. To the extent that a term or phrase is intended to have a special meaning, such a special definition will be expressly set forth in the specification in a definitional manner that directly and unequivocally provides the special definition for the term or phrase.

The present disclosure is directed to various methods of forming nanowire devices with spacers and the resulting devices. As will be readily apparent, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

In the depicted examples, the device 200 will be disclosed in the context of performing FinFET formation techniques. However, the present disclosure should not be considered to be limited to the examples depicted herein. The substrate 101 may include a variety of configurations, such as a bulk silicon configuration or an SOI configuration. Thus, the terms "substrate" or "semiconducting substrate" should be understood to cover all substrate configurations. The substrate 101 may also be made of materials other than silicon.

Figure 2A:
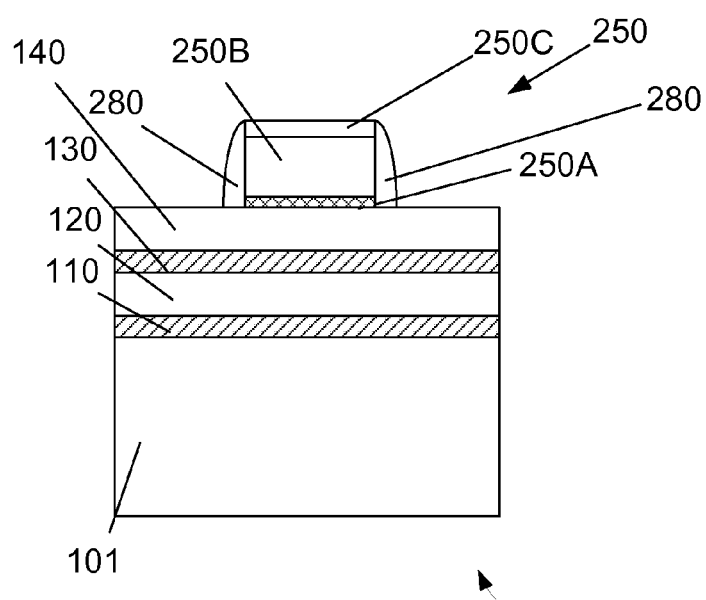
FIGS. 2A-2G depict various novel methods disclosed herein of forming nanowire devices with spacers and the resulting novel nanowire devices.

FIG. 2A depicts a device 200 after several process operations were performed. First, various layers of semiconducting material 110, 120, 130 and 140 were formed above the silicon substrate 101. In general, in the depicted example, the layers 110 and 130 include a semiconductor material that may be selectively removed or etched relative to the materials used for the semiconducting material layers 120 and 140. As described more fully below, in the channel region of the device 200, portions of the semiconductor material layers 110 and 130 will be removed while the semiconducting material layers 120 and 140 will be left in place. Thus, the portions of the semiconducting material layers 110 and 130 within the channel region of the device 200 are sacrificial in nature. The semiconductor materials 110, 120, 130 and 140 may include a variety of different materials such as, for example, silicon, doped silicon, silicon-carbon, silicon-germanium, a III-V material, germanium, etc., and they may be formed to any desired thickness by performing any appropriate process, e.g., an epitaxial growth process, deposition plus ion implantation, etc. In one embodiment, the layer 110 and the layer 130 are made of silicon-germanium, while the semiconducting material layers 120 and 140 are made of silicon. The thickness of the layers 110, 120, 130 and 140 may vary depending upon the application, and they may be formed to the same or different thicknesses.

Next, an illustrative gate structure 250 was formed above the layer 140. The illustrative gate structure 250 is intended to be representative in nature of any type of gate structure that may be formed on a nanowire device. In the depicted example, the gate structure 250 includes a gate insulation layer 250A, a gate electrode 250B and a gate cap layer 250C. A deposition process or thermal growth process may be performed to form the gate insulation layer 250A, which includes silicon dioxide in one embodiment. Thereafter, the material for the gate electrode 250B and the material for the gate cap layer 250C may be deposited above the device 200, and the layers may be patterned by performing known photolithographic and etching techniques. The gate electrode 250B may include a variety of materials such as polysilicon or amorphous silicon. The gate cap layer 250C, the gate electrode 250B and the gate insulation layer 250A are sacrificial in nature as they will be removed at a later point during the formation of the device 200. Finally, the sidewall spacer 280 may be formed adjacent to the gate structure 250. The sidewall spacer 280 may be formed by depositing a layer of spacer material, such as silicon nitride, and thereafter performing an anisotropic etching process to define the spacer 280.

Figure 2B:
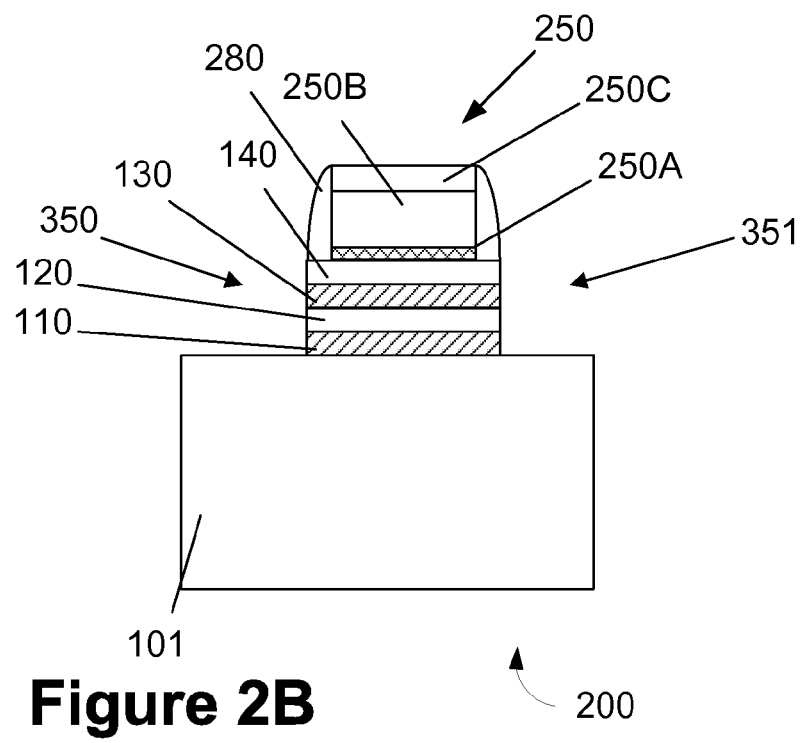

Next, as shown in FIG. 2B, one or more etching processes were performed to remove the exposed portions of the material layers 110-140 that were not covered by the gate structure 250 and the spacer 280. The etching processes may include dry etching and wet etching techniques to remove materials from the device 200. The etching process exposed vertical end surfaces of the material layers 110-140 and they are generally referred to as the first end surface 350 and the second end surface 351.

Figure 2C:
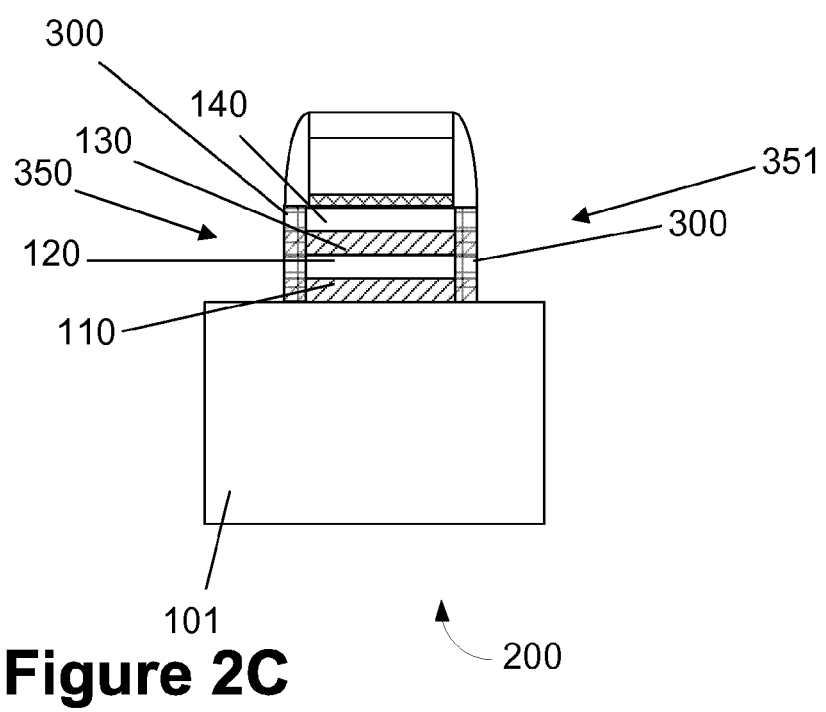

Next, as shown in FIG. 2C, one or more angled ion implantation processes were performed on the first end surface 350 and the second end surface 351 of the material layers 110, 120, 130 and 140 to form doped extension regions 300. Due to shadowing caused by the presence of adjacent gate structures (not shown), few if any ions are implanted into the substrate 101 during the angled ion implantation process. Consequently, by performing the methods disclosed herein, the doped extension regions 300 formed in the end surfaces 350 and 351 of the semiconducting layers 110, 120, 130 and 140 are substantially uniform in terms of dopant concentration and depth. As such, each of the layers 110, 120, 130 and 140 has the substantially the same extension implant dopant profile. Additionally, a substantially abrupt junction between the doped region in the material and the undoped regions in the material was formed. The doping process was performed prior to epitaxy regrowth in at least one embodiment, and specifically, prior to the formation of the source and drain regions for the device 200. The doping may be performed with N- or P-type dopant materials depending upon the device under construction. The implant angle, dopant dose and energy level of the ion implantation process may vary depending upon the particular application. If desired, carbon may be introduced into the regions 300 in an effort to limit dopant migration.

Figure 2D:
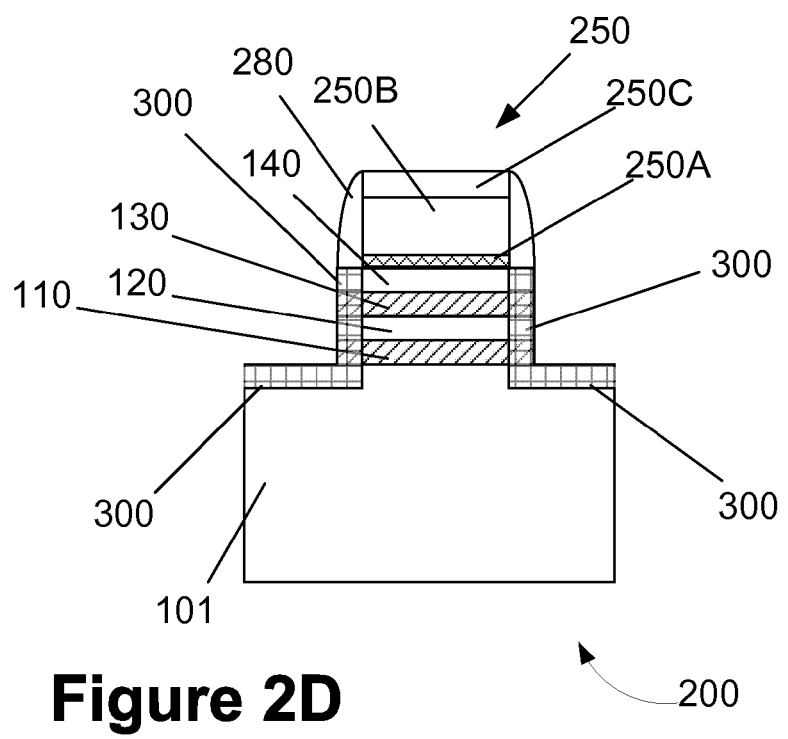

FIG. 2D depicts an embodiment wherein the extension regions 300 may be formed by performing a plasma doping process instead of an ion implantation process, as depicted in FIG. 2C. Performing a plasma doping process results in the formation of the doped extension regions 300 in the first and second end surfaces 350 and 351 of the material layers 110-140 as well as in the portions of the substrate 101 not positioned under the gate structure 250 and the sidewall spacer 280. That is, a plasma doping process may be used to avoid the shadowing effect experienced when performing an angled ion implantation process, which occurs when the height and close spacing of adjacent gate structures prevents homogenous doping of the lower layers. In one illustrative embodiment, the plasma doping process may be performed prior to epitaxy regrowth. If desired, carbon may be introduced into the regions 300 during or before the plasma doping process in an effort to limit dopant migration. During plasma doping, plasma is first generated over the wafer and a potential is applied to the wafer. Ionized dopants are accelerated towards the voltage-biased wafer, and the dopants are implanted into the wafers at energies determined by the applied voltage. During this plasma doping process, a thin film may form on the device. However, so as not to obscure the present invention, such a thin film is not depicted in the attached drawings.

Figure 2E:
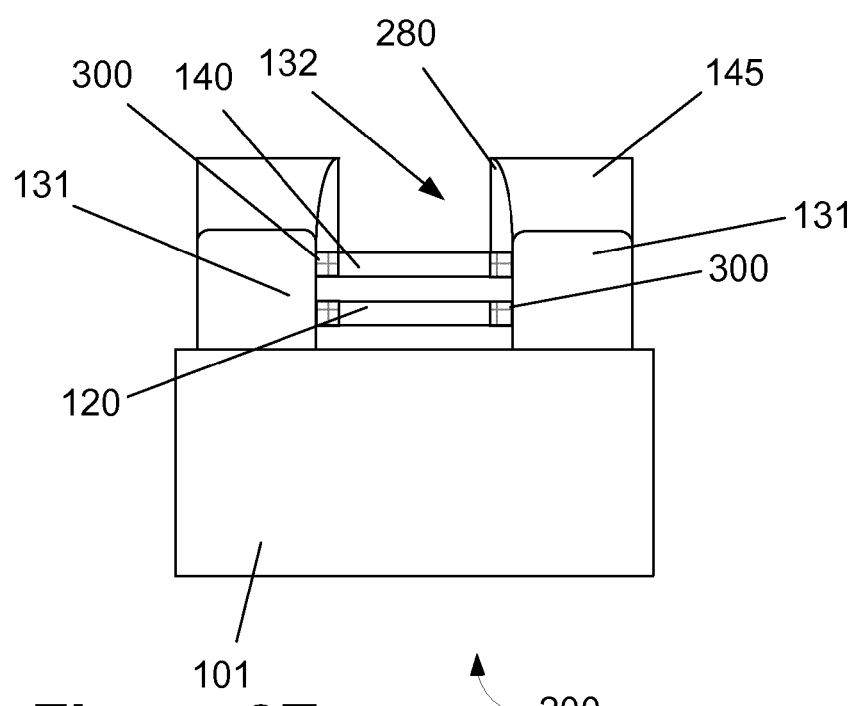

FIG. 2E depicts the device 200 of FIG. 2D after several process operations were performed. First, raised epitaxial (epi) source/drain regions 131 were formed on the device 200 by performing known epi deposition processes. As depicted, the epi source/drain regions 131 will engage the doped extension regions 300 in the layers 120, 140. Next, a layer of insulating material 145 was deposited onto the device 200 by performing one or more deposition processes. Any excess insulating material 145 positioned above the gate structure was removed by performing one or more planarization or etching processes. Additionally, the materials of the sacrificial gate structure 250 were removed by performing one or more etching processes so as to define a gate cavity 132. The removal of the gate structure 250 exposes the layers 110 and 130 for further processing. Next, the layers 110 and 130 were selectively removed relative to the layers 120 and 140 by performing one or more etching processes through the gate cavity 132.

Figure 2F:
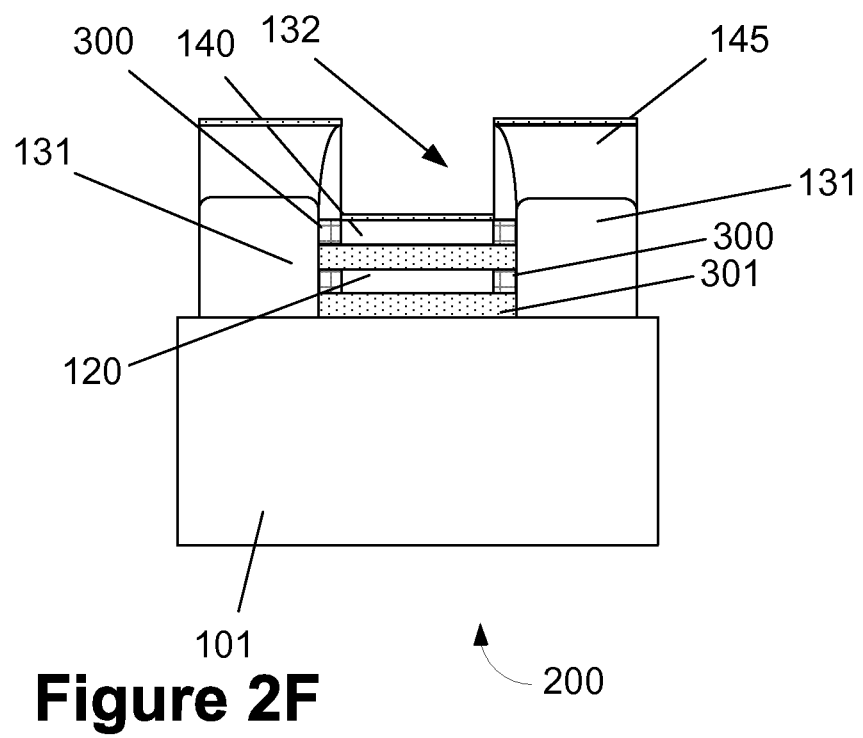

FIG. 2F depicts the device 200 of FIG. 2E after one or more process operations were performed. Specifically, an insulator 301 was deposited, such that it overfilled the openings left by the removed layers 110 and 130, by performing one or more deposition processes. In various embodiments, the insulator 301 includes silicon dioxide or a low-k material (a material having a dielectric constant less than about 3.3). The insulator 301 is selected such that it can be selectively removed relative to the layer of insulating material 145, the sidewall spacer 280 and the surrounding structures.

Figure 2G:
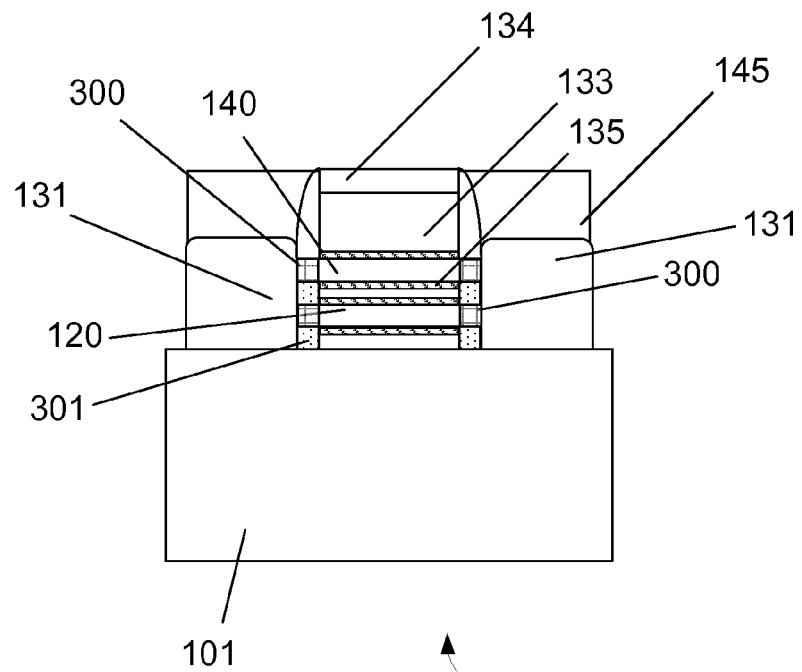

FIG. 2G illustrates the device 200 of FIG. 2F after several process operations were performed. First, a portion of the insulator 301 was removed by performing one or more anisotropic etching processes leaving portions of the layer of the insulator 301 positioned under the doped regions 300. Second, a high-k gate insulation material 135 (a material having a dielectric constant greater than about 10) was deposited onto the nanowires 120 and 140 by performing one or more deposition processes. Next, a replacement gate structure including a replacement gate electrode 133 was formed in the gate cavity 132. The replacement gate electrode 133 may include of a variety of conductive materials, such as one or more metal layers, in various embodiments. Next, a CMP process was performed to remove excess materials positioned outside of the gate cavity 132 above the layer of insulating material 145. A recess etching process was then performed on the gate electrode 133 to make room for the gate cap 134. The gate cap 134 was formed by depositing a layer of gate cap material, e.g., silicon nitride, and thereafter performing a planarization process (CMP) to remove gate cap materials above the layer of insulating material 145 to arrive at the device 200 configuration shown.

Figure 3A:
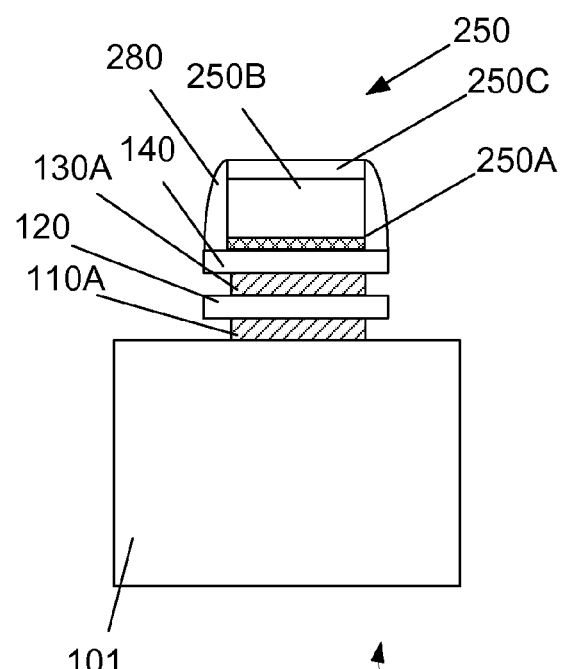
FIGS. 3A-3C depict various novel methods disclosed herein of forming nanowire devices with spacers and the resulting novel nanowire devices.
Figure 3B:
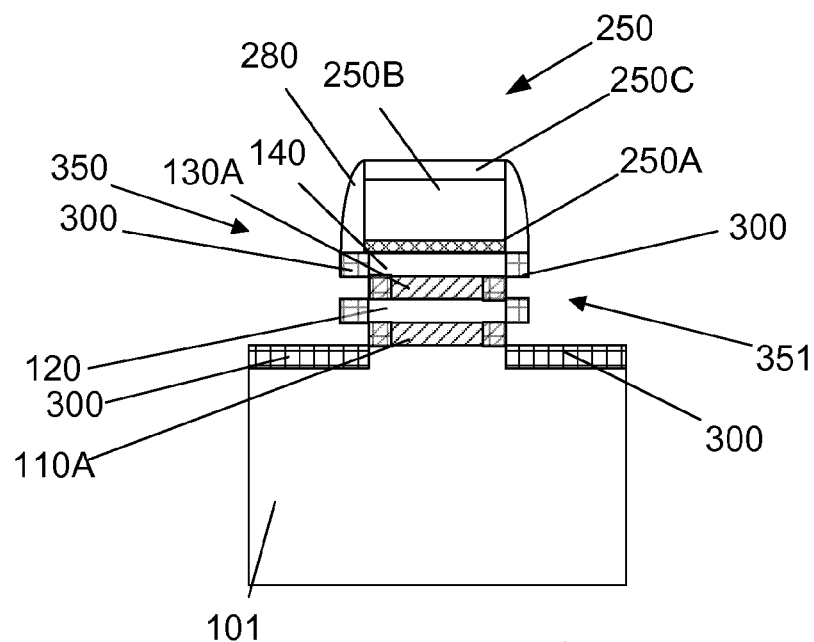

In addition to doping techniques prior to epi regrowth, recessing layers of the device may also improve the similarity of the nanowire dopant profiles. FIGS. 3A-3B depict an embodiment wherein the layers of material 110 and 130 are recessed prior to performing the above-described plasma doping process. Accordingly, FIG. 3A depicts the device 475 after the layers 110, 120, 130 and 140 were patterned and after the layers 110 and 130 were selectively recessed by performing one or more etching processes to define layers 110A and 130A such that they have a shorter length (in the current transport direction), as viewed in cross-section, than the layers 120 and 140. In at least one embodiment, the layers 110A and 130A are recessed such that the ends of the recessed materials 110A and 130A are approximately aligned with the interface between the sidewall spacer 280 and the gate electrode 250B, as viewed in cross-section.

Next, as shown in FIG. 3B, the above-described plasma doping process was performed on the first end surface 350 and the second end surface 351 (now staggered rather than being substantially vertically aligned) of the layers 110A, 120, 130A and 140 so as to form the above-described extension implant regions 300 in those layers, as well as in the exposed portions of the substrate 101. As such, the layers 110A and 130A have substantially the same dopant profile, and the layers 120 and 140 have substantially the same dopant profile. Furthermore, a substantially abrupt junction between doped material and undoped material was formed.

Figure 3C:
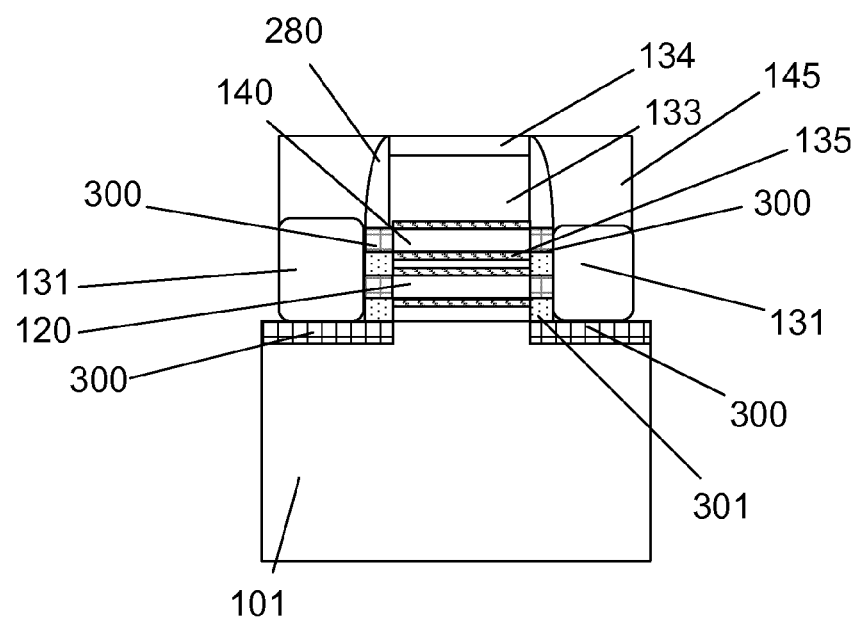

FIG. 3C depicts the device 475 after several process operations were performed. First, raised epitaxial (epi) source/drain regions 131 were formed on the device 475 by performing known epi deposition processes. Next, a layer of insulating material 145 was deposited onto the device 475 by performing one or more deposition processes. Any excess insulating material 145 was removed by performing one or more planarization or etching processes. Next, the sacrificial gate structure 250 and the sacrificial layers 110A and 130A were removed by performing one or more etching processes. The above-described insulator 301 was then deposited, such that it overfilled the openings left by the removed layers 110 and 130.

Next, a portion of the insulator 301 was removed by performing one or more anisotropic etching processes, leaving portions of the insulator 301 positioned under the doped regions 300 of the nanowires 120 and 140. Next, a high-k gate insulation material 135 was deposited onto the nanowires 120 and 140. Finally, a replacement gate structure including the above-described replacement gate electrode 133 and replacement gate cap 134 was formed as described above.

Figure 4A:
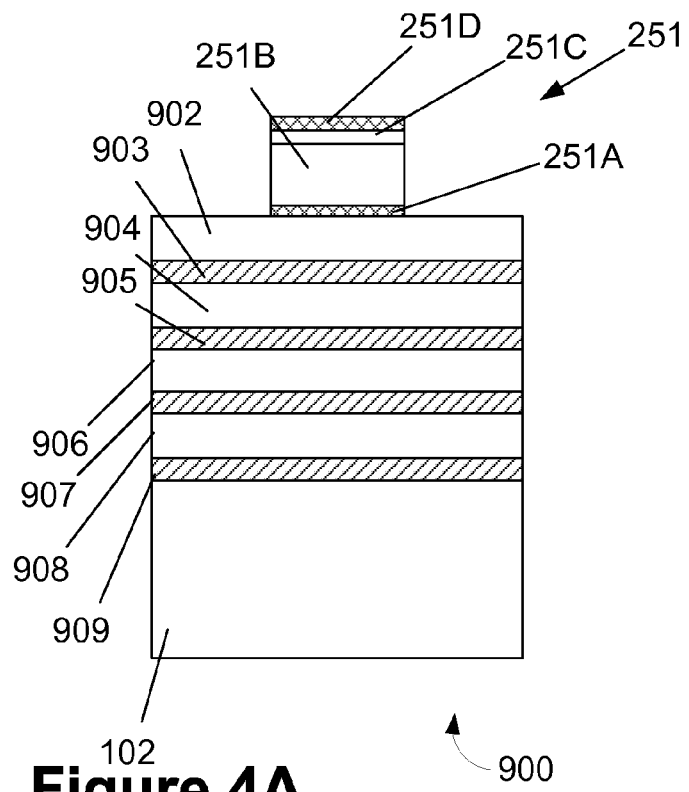
FIGS. 4A-4R depict various novel methods disclosed herein of forming nanowire devices with spacers and the resulting novel nanowire devices.
Figure 4B:
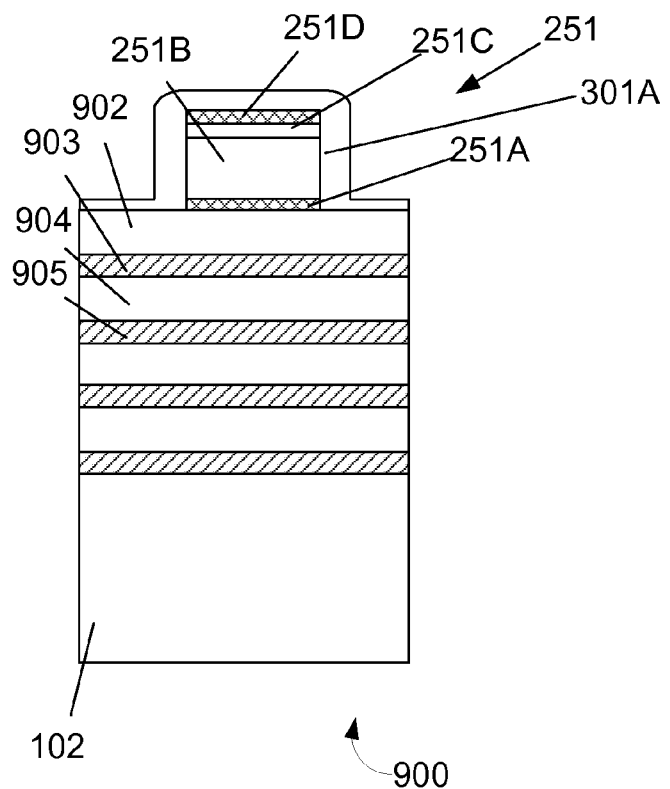
Figure 4C:
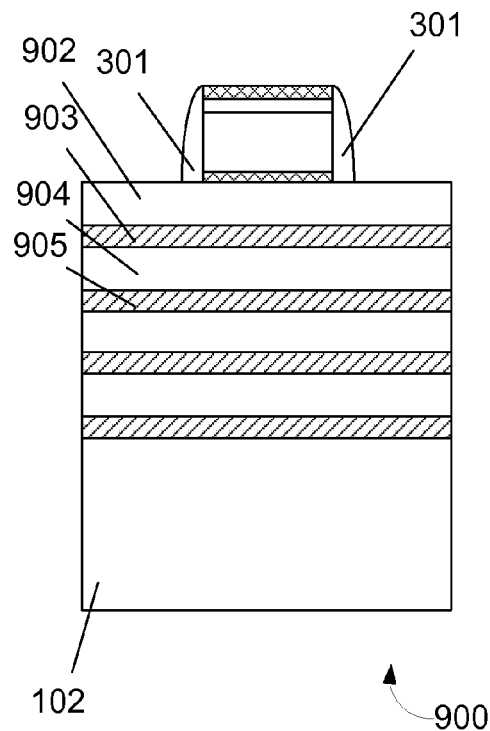
Figure 4D:
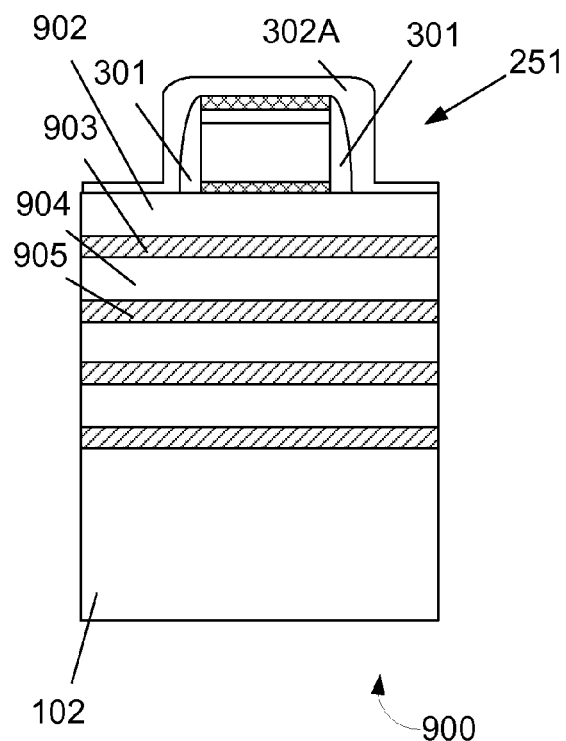
Figure 4E:
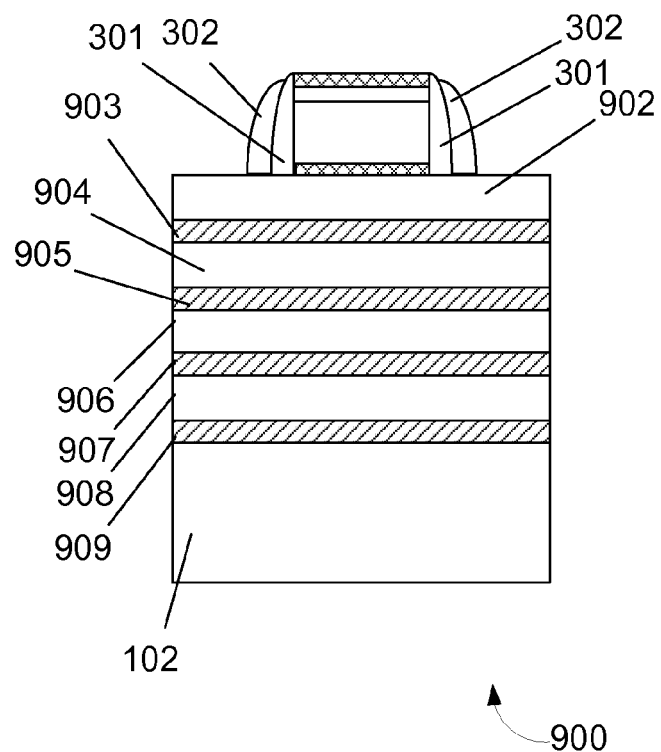
Figure 4F:
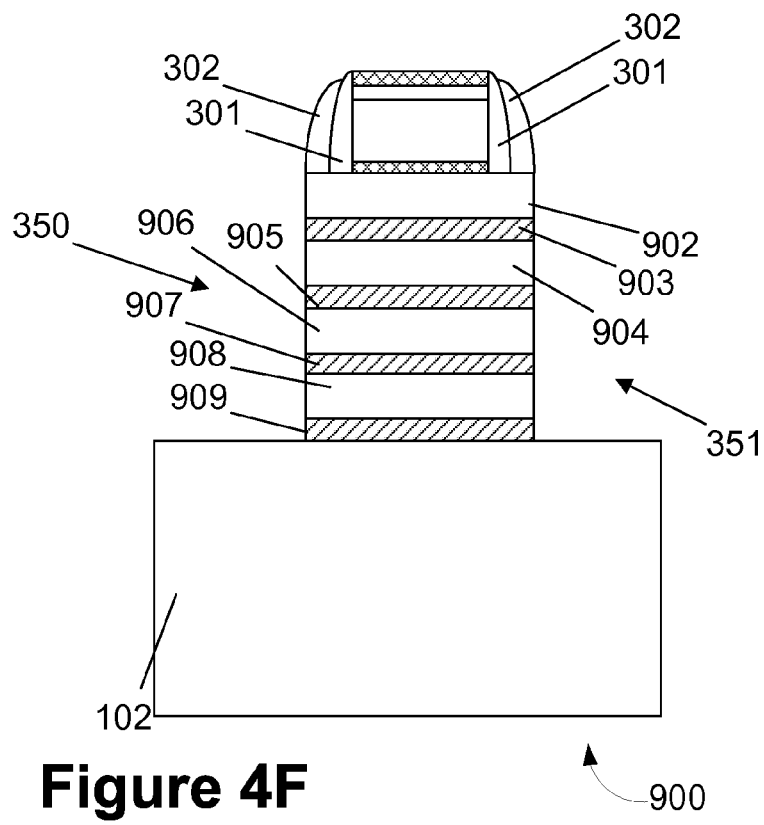
Figure 4G:
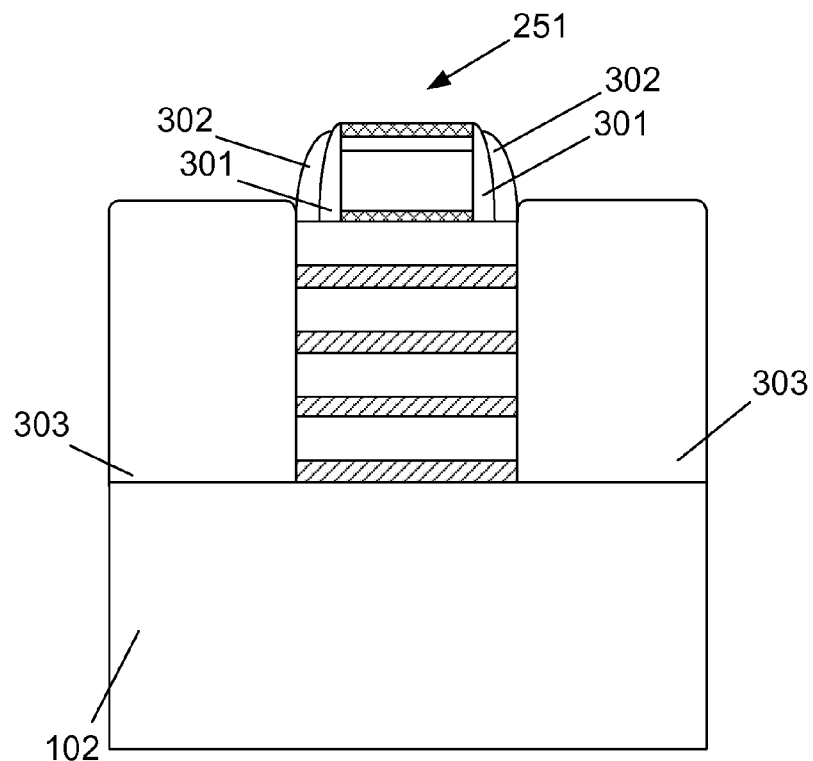
Figure 4H:
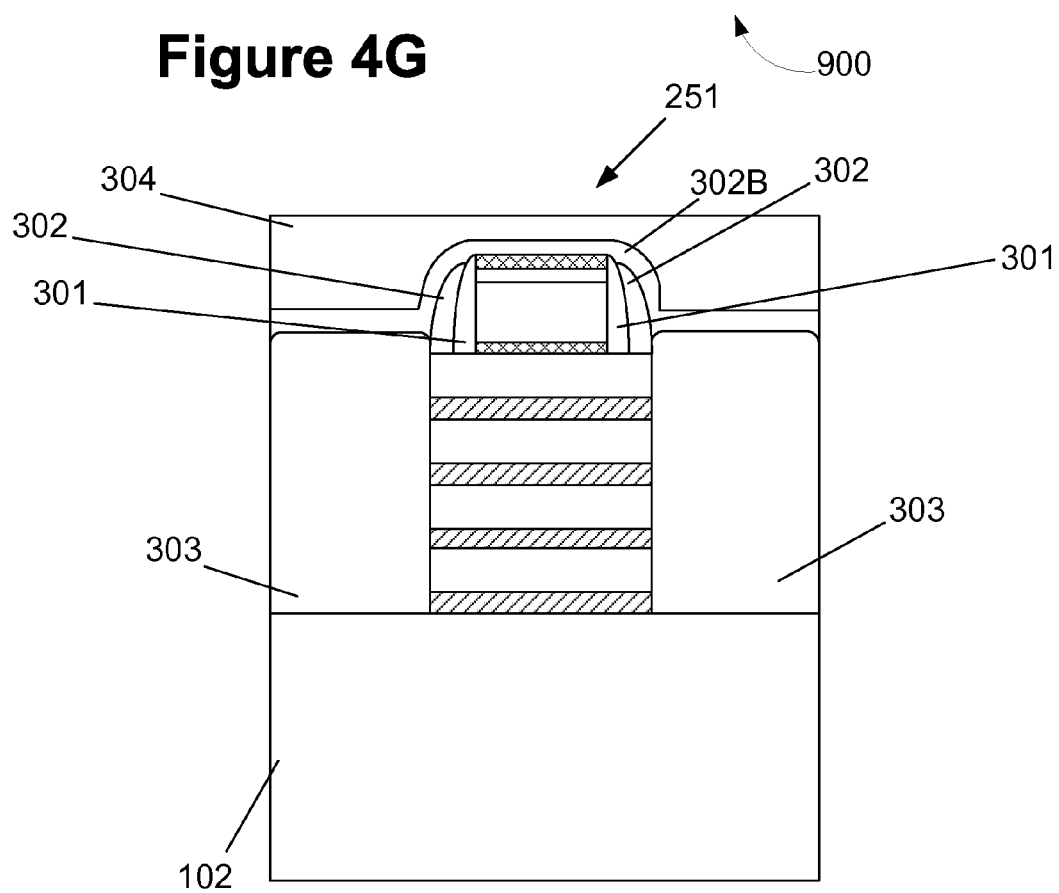
Figure 4I:
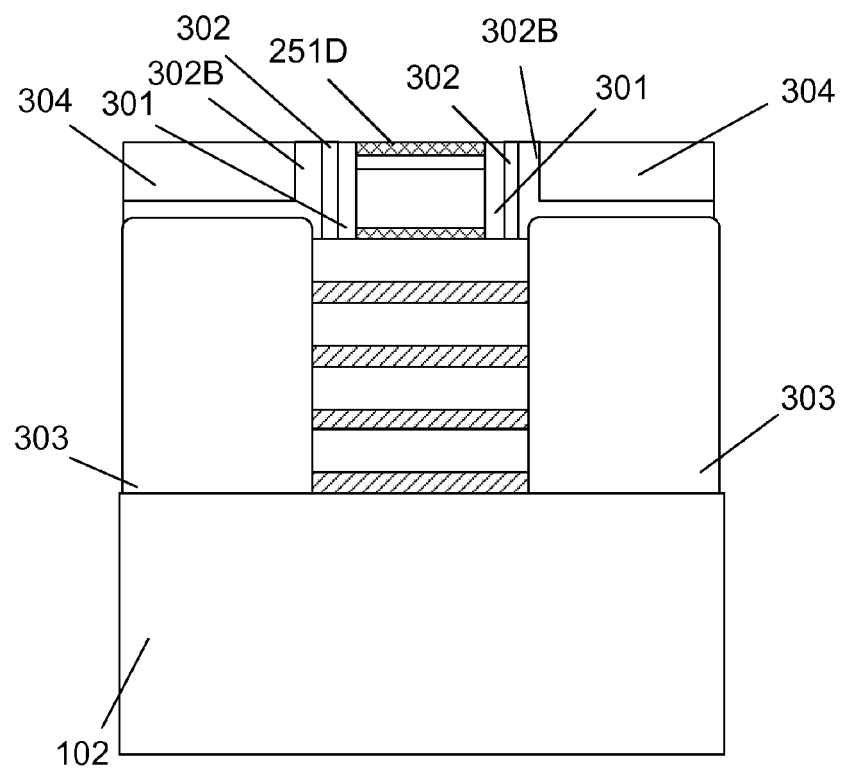
Figure 4J:
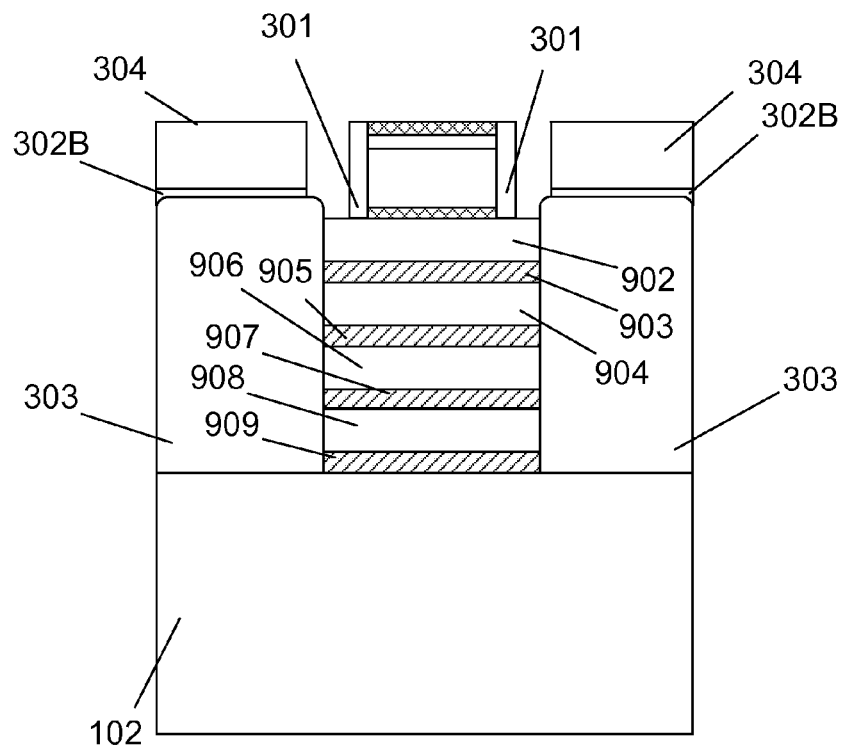
Figure 4K:
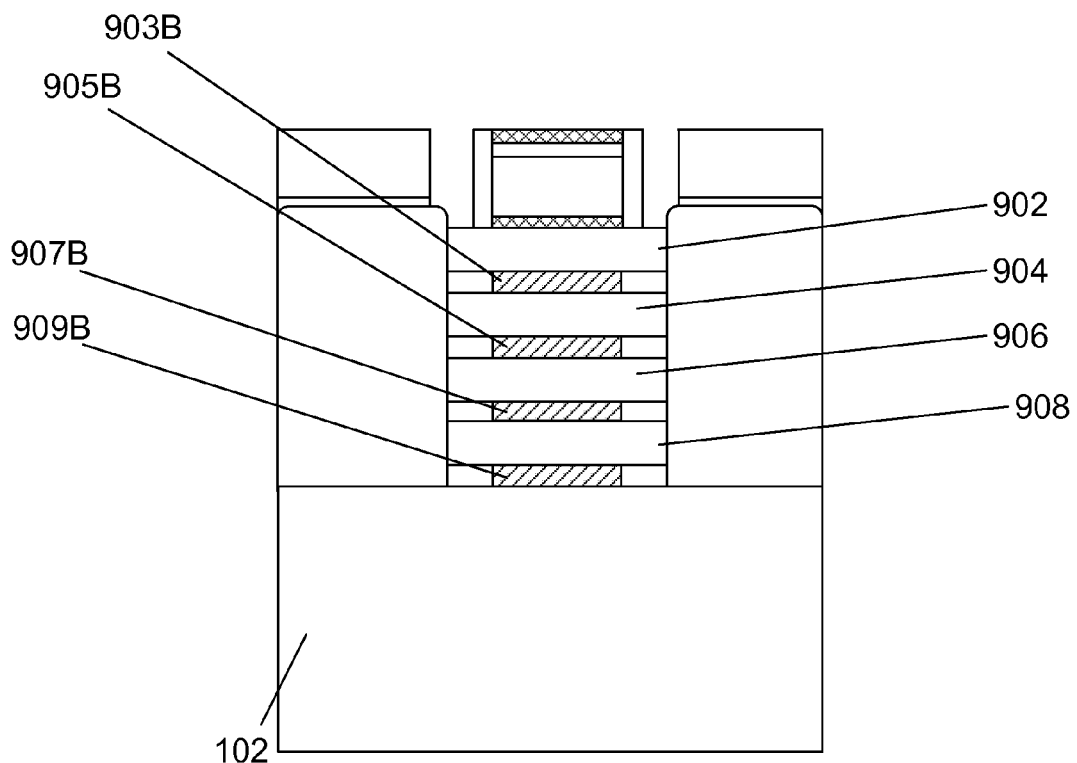
Figure 4L:
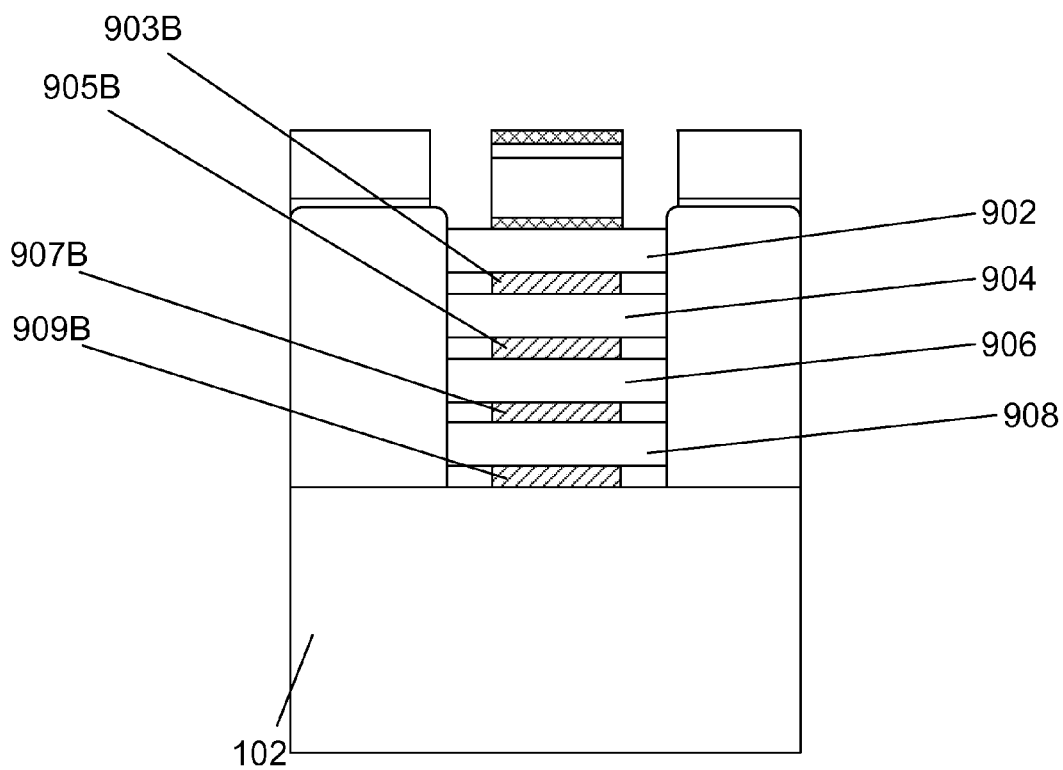
Figure 4M:
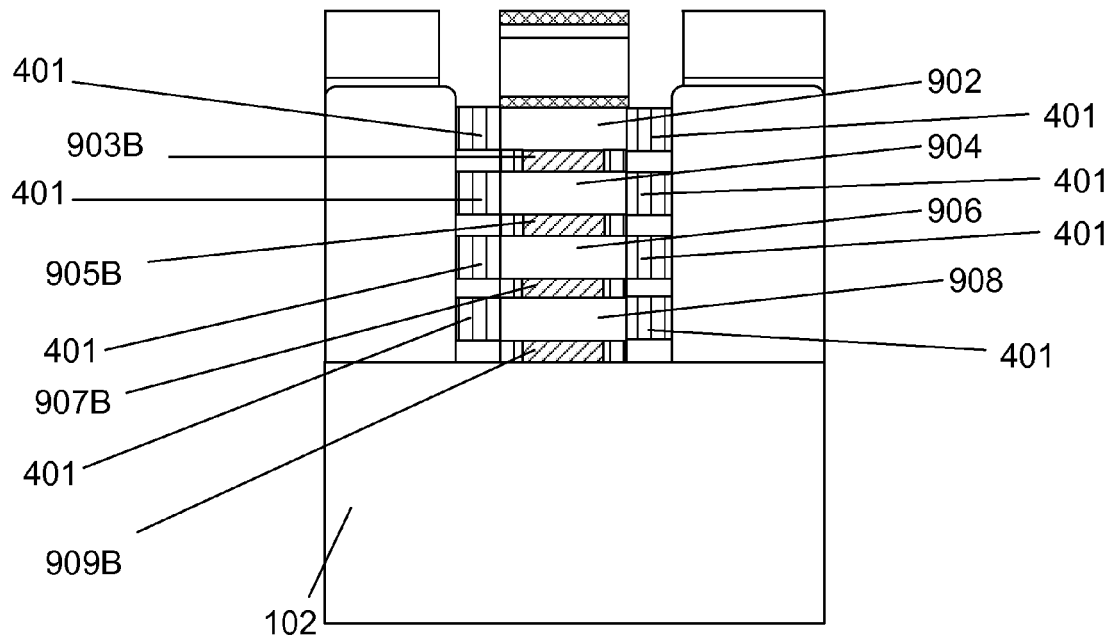
Figure 4N:
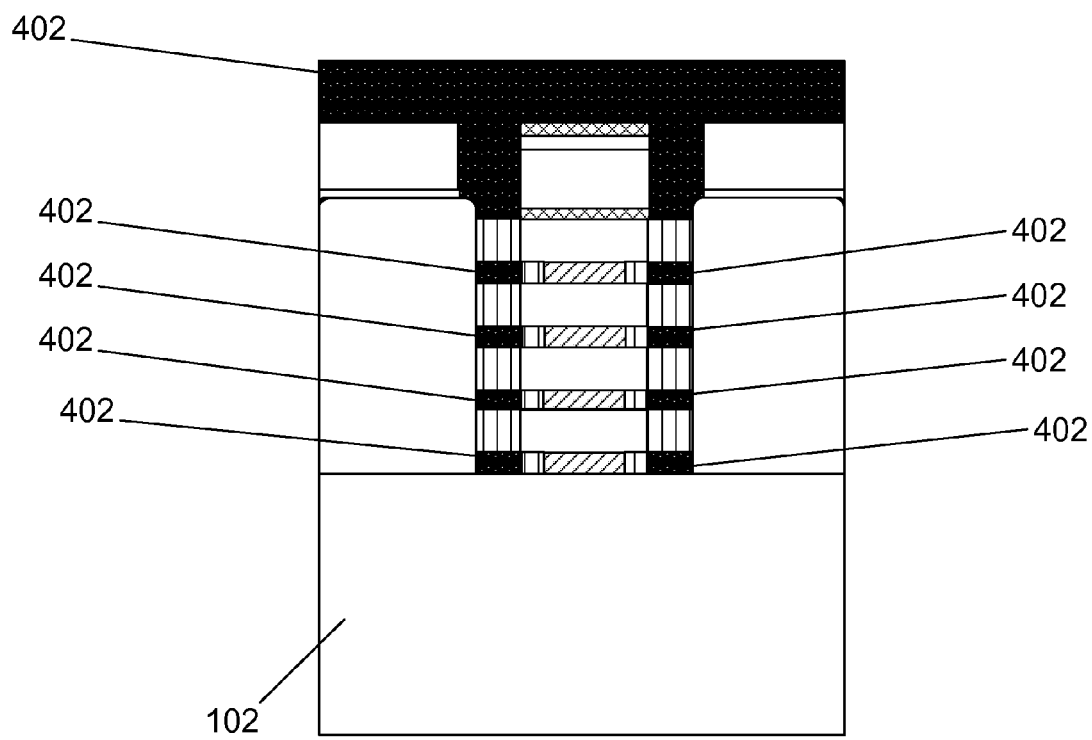
Figure 4O:
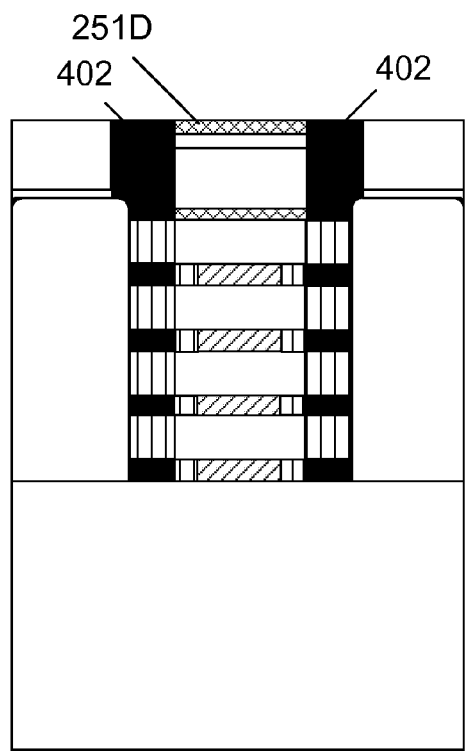
Figure 4P:
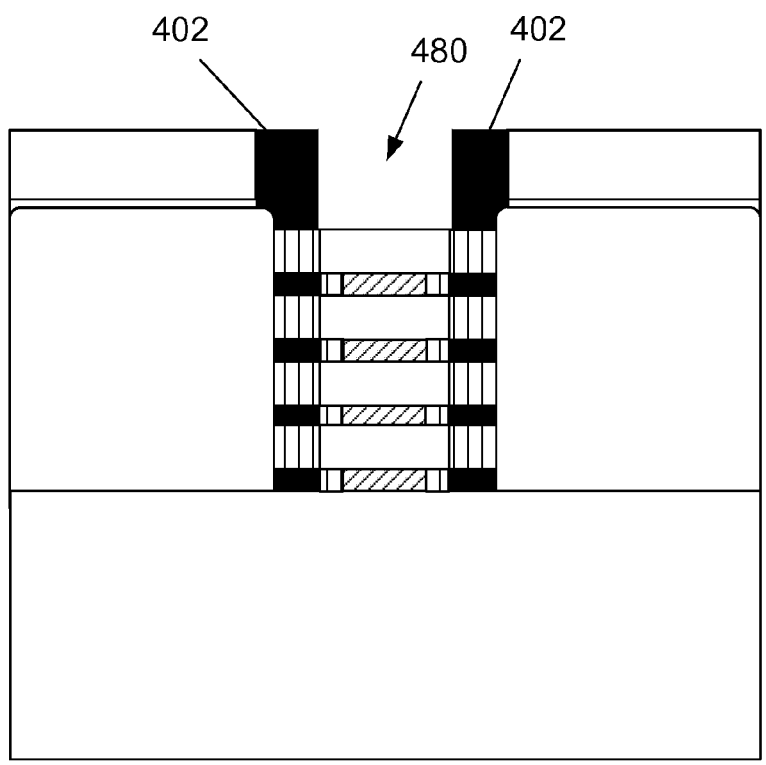
Figure 4Q:
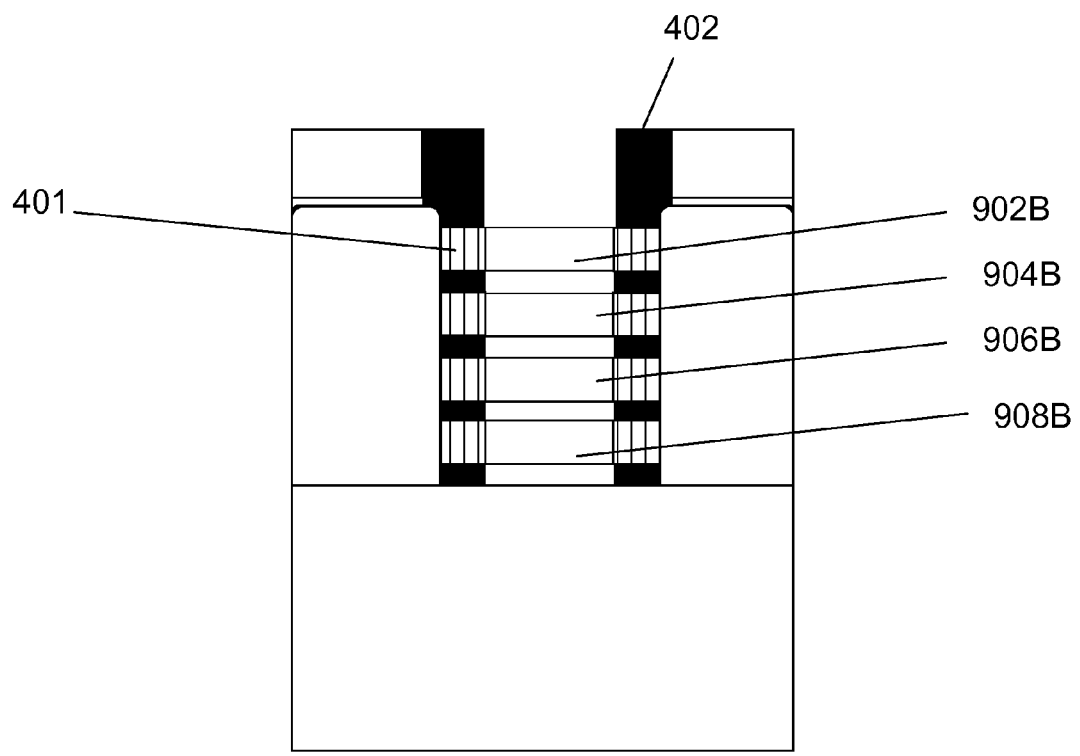
Figure 4R:
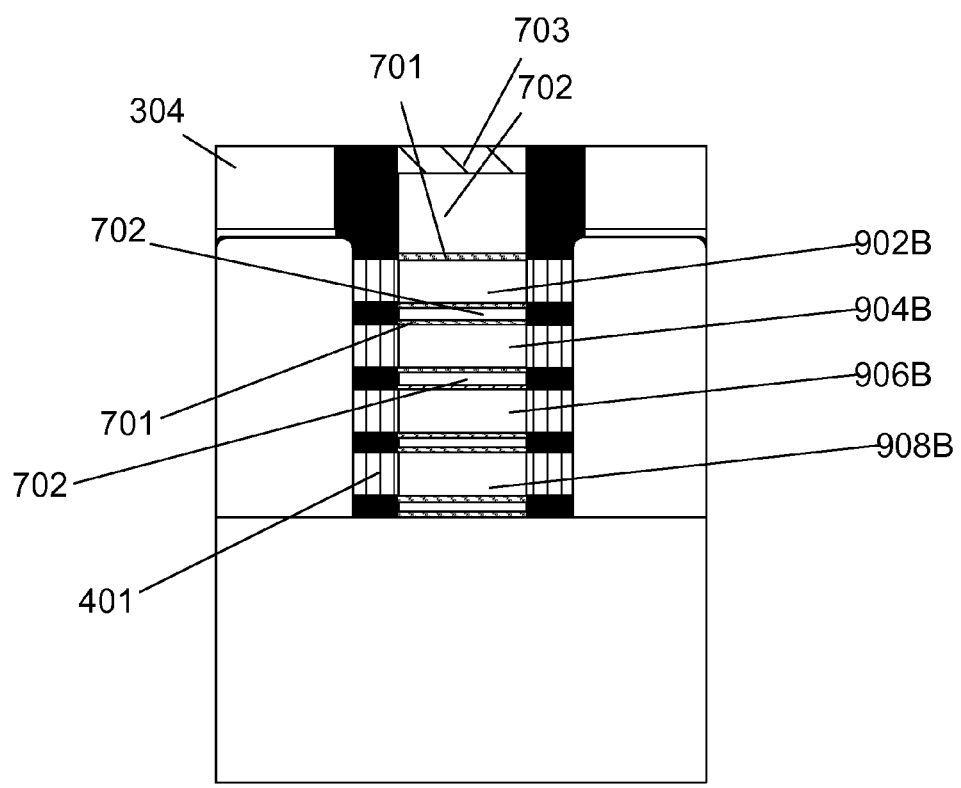

FIGS. 4A-4R depict various cross sectional views of one illustrative embodiment of a nanowire device 900 that may be formed by performing the methods disclosed herein. In the illustrative example depicted herein, the device 900 will be depicted as including four illustrative nanowires. Of course, after a complete reading of the present application, those skilled in the art will appreciate that the methods disclosed herein may be employed to form a nanowire device with any desired number of nanowires, e.g., one or more nanowires.

With continuing reference to FIG. 4A, various layers of semiconducting material 909, 908, 907, 906, 905, 904, 903 and 902 are formed above the substrate 102. In general, in the depicted example, the layers 909, 907, 905 and 903 include a semiconductor material that may be selectively removed or etched relative to the materials used for the semiconducting material layers 908, 906, 904 and 902. As described more fully below, in the channel region of the device 900, portions of the semiconductor material layers 909, 907, 905 and 903 will be removed while portions of the semiconducting material layers 908, 906, 904 and 902 will be left in place as nanowires. Thus, the portions of the semiconducting material layers 909, 907, 905 and 903 within the channel region of the device are sacrificial in nature. The semiconductor materials 909, 908, 907, 906, 905, 904, 903 and 902 may include a variety of different materials such as, for example, silicon, a doped silicon, silicon-carbon, silicon-germanium, a III-V material, germanium, etc., and they may be formed to any desired thickness by performing any appropriate process, e.g., an epitaxial growth process, deposition plus ion implantation, etc. In one embodiment, the semiconducting material layers 909, 907, 905 and 903 include silicon-germanium with a thickness of about 6-25 nm, while the semiconducting material layers 908, 906, 904 and 902 include silicon also with a thickness of about 6-25 nm. In various embodiments, the layers 909, 907, 905 and 903 are not made of the same semiconducting material and they are not the same thickness. Similarly, in some embodiments, the layers 908, 906, 904, and 902 are not made of the same semiconducting material and they are not the same thickness in various embodiments.

Also depicted in FIG. 4A is an illustrative gate structure 251. The gate structure 251 may include a variety of different materials and a variety of configurations. As shown, the gate structure 251 includes a gate insulation layer 251A, a gate electrode 251B and a dual layer cap comprised of a first cap layer 251C and a second cap layer 251D. A deposition process may be performed to form the gate insulation layer 251A, which includes silicon dioxide in one embodiment. Thereafter, the materials for the gate electrode 251B and the gate cap layers 251C and 251D may be deposited above the device 900, and the layers may be patterned by performing known photolithographic and etching techniques. The gate electrode 251B may include a variety of materials such as polysilicon or amorphous silicon. The gate structure 251 and its various components are sacrificial in various embodiments because they will be removed during further formation of the device 900. In at least one embodiment, the first gate cap layer 251C may be silicon nitride, and the second gate cap layer 251D may be silicon dioxide.

FIG. 4B illustrates the device 900 after a layer of spacer material 301A, such as silicon nitride in at least one embodiment, was conformably deposited over the gate structure 251 and the layer 902 by performing one or more deposition processes. In various embodiments, the spacer material 301A includes an oxide, a nitride or other sacrificial material. The thickness of the layer 301A may vary depending upon the application.

FIG. 4C illustrates the device 900 after one or more etching processes, such as an anisotropic etch in at least one embodiment, were performed on the layer 301A to define the first sidewall spacer 301.

FIG. 4D illustrates the device 900 after another layer of spacer material 302A, such as oxynitride in at least one embodiment, was conformably deposited over the gate structure 251 and the layer 902 by performing a conformal deposition process. In various embodiments, the spacer material 302A may be made of an oxide, a nitride or other sacrificial material. In at least one embodiment, the spacer material 302A is different from the spacer material 301A such that the resulting spacers may be selectively removed relative to one another.

FIG. 4E illustrates the device 900 after an anisotropic etching process was performed on the layer 302A to define the second sidewall spacer 302.

FIG. 4F illustrates the device 900 after one or more etching processes were performed to remove the exposed portions of the layers 909, 908, 907, 906, 905, 904, 903 and 902 using the gate structure 251 and the spacers 301 and 302 as an etch mask. The patterning of the layers 909, 908, 907, 906, 905, 904, 903 and 902 results in those layers having exposed end portions 350, 351. For simplicity, the semiconductor materials are depicted as having a rectangular shape with sharp corners.

FIG. 4G illustrates the device 900 after one or more epitaxial deposition processes were performed to form an epitaxial semiconductor layer 303, on either side of the gate structure 251, that functions as source and drain regions for the device 900. The epi material 303 may be doped in situ or it may be doped after it is formed by performing an ion implantation process.

FIG. 4H illustrates the device 900 after a contact etch stop layer 302B, such as oxynitride or silicon nitride in at least one embodiment, and a layer of insulating material 304 (e.g., silicon dioxide) was deposited over the gate structure 251 and the epitaxial layer 303.

FIG. 4I illustrates the device 900 after a planarization process (CMP) was performed to remove excess materials using the gate cap layer 251D as a stop.

FIG. 4J illustrates the device 900 after one or more etching processes were performed to remove the second spacer 302 and the exposed portion of the etch stop layer 302B not covered by the layer of insulating material 304 selectively relative to the surrounding materials. Consequently, the material layers 902-909 of the device 900 are exposed for further processing.

FIG. 4K illustrates the device 900 after a selective etching process was performed to remove portions of the layers 909, 907, 905 and 903 and thereby define recessed layers 909B, 907B, 905B and 903B. The layers were selectively recessed by performing one or more etching processes such that they have a shorter length (in the channel length (current transport) direction of the device 900), than do the layers 908, 906, 904 and 902. In at least one embodiment, the layers 909B, 907B, 905B and 903B are recessed enough such that the ends of the recessed materials 909B, 907B, 905B and 903B are approximately aligned with the interface between the sidewall spacer 301 and the gate electrode 251B, as viewed in cross-section.

FIG. 4L illustrates the device 900 after one or more etching processes were performed to remove the first spacer 301 selectively relative to the surrounding materials.

FIG. 4M illustrates the device 900 after the above-described plasma doping process was performed on the device 900. Consequently, doped extension regions 401 were formed in the end portions of the layers 902, 904, 906, 908, 903B, 905B, 907B and 909B. As such, the layers 908, 906, 904 and 902 have substantially the same dopant profile. Furthermore, a substantially abrupt junction between doped material and undoped material was formed.

FIG. 4N illustrates the device 900 after deposition of a low-k spacer material 402 (a material having a dielectric constant less than about 3.3).

FIG. 4O illustrates the device 900 after a planarization process (CMP) was performed to remove excess spacer material 402 using the gate cap layer 251D as a stop.

FIG. 4P illustrates the device 900 after one or more etching processes were performed to remove the gate cap layers 251D and 251C, the gate electrode 251B and the gate insulation layer 251A. These etching processes result in the formation of a gate cavity 480 and expose the material layers of the device 900 for further processing.

FIG. 4Q illustrates the device 900 after the layers 909B, 907B, 905B and 903B were removed via selective etching processes leaving the nanowires 908B, 906B, 904B and 902B that include the doped extension implant regions 401 intact.

FIG. 4R illustrates the device 900 after several processes were performed. First, a high-k gate insulation material 701 (material having a higher dielectric constant than about 10) was deposited onto the nanowires 908B, 906B, 904B and 902B by performing one or more deposition processes. Next, a replacement gate electrode 702 was formed in the gate cavity 480. The replacement gate electrode 702 may include a variety of conductive materials, such as polysilicon as well as one or more metal layers, in various embodiments. Next, a CMP process was performed to remove excess materials positioned outside of the gate cavity above the layer of insulating material 304. Thereafter, a recess etching process was performed to remove some of the gate electrode material from within the gate cavity to make room for a gate cap layer. Then a nitride material was deposited to form a replacement gate cap 703. Next, a planarization process (CMP) was performed to remove excess nitride materials using the layer 304 as a stop to arrive at the device 900 configuration shown.

In the examples described herein, the channel structures of the devices are depicted as including two or four illustrative nanowires. However, the channel structure may include any desired number of nanowires and in some cases may include only a single nanowire. Thus, the disclosure should not be considered as being limited to any particular number of nanowires. The creation of nanowires with similar characteristics as described herein allows for improved performance, reliability and predictability.

The particular embodiments disclosed above are illustrative only, as the disclosure may be modified and practiced in different but equivalent manners apparent to those having the benefit of the teachings herein. Furthermore, no limitations are intended to the details of construction or design herein shown, other than as described in the claims below.

It is therefore evident that the particular embodiments disclosed above may be altered or modified and all such variations are considered within the scope and spirit of the disclosure. Accordingly, the protection sought herein is as set forth in the claims below.

What is claimed:

1. A method of forming a nanowire device, comprising:
   forming a plurality of semiconductor material layers above a semiconductor substrate;
   forming a gate structure above said plurality of semiconductor material layers;
   forming a first sidewall spacer adjacent to said gate structure;
   forming a second sidewall spacer adjacent to said first sidewall spacer;
   patterning said plurality of semiconductor material layers such that each layer has first and second exposed end surfaces, wherein said gate structure, said first sidewall spacer and said second sidewall spacer are used in combination as an etch mask during said patterning process;
   removing at least said second sidewall spacer, thereby exposing at least a portion of said patterned semiconductor material layers; and
   after removing at least said second sidewall spacer, forming doped extension regions in exposed portions of each of said patterned semiconductor material layers.

2. The method of claim 1, further comprising:
   recessing at least a first of said semiconductor material layers relative to a second of said semiconductor material layers after removing said second sidewall spacer;
   removing said first sidewall spacer after recessing said at least said first of said semiconductor material layers; and
   forming said doped extension regions after removing said first sidewall spacer.

3. The method of claim 1, wherein forming said doped extension regions comprises forming said doped extension regions such that said semiconductor material layers have substantially the same dopant profile.

4. The method of claim 1, wherein forming said doped extension regions comprises doping said exposed portions of each of said patterned semiconductor material layers by performing a plasma doping process.

5. The method of claim 1, wherein said first sidewall spacer comprises a nitride and said second sidewall spacer comprises an oxide.

6. The method of claim 1, further comprising forming source and drain regions adjacent said first and second exposed end surfaces prior to forming said doped extension regions.

7. A method of forming a nanowire device, comprising:
   forming a first sidewall spacer adjacent to a gate structure;
   forming a second sidewall spacer adjacent to said first sidewall spacer;
   patterning a plurality of semiconductor material layers such that each layer has first and second exposed end surfaces, wherein said gate structure, said first sidewall spacer and said second sidewall spacer are used in combination as an etch mask during said patterning process;
   exposing at least a portion of said patterned semiconductor material layers; and
   forming doped extension regions in exposed portions of each of said patterned semiconductor material layers.

8. The method of claim 7, further comprising forming said plurality of semiconductor material layers above a semiconductor substrate.

9. The method of claim 7, further comprising forming said gate structure above said plurality of semiconductor material layers.

10. The method of claim 7, wherein exposing at least a portion of said patterned semiconductor material layers comprises removing at least one of said first and second sidewall spacers.

11. The method of claim 7, further comprising:
    removing said second sidewall spacer to expose said at least a portion of said patterned semiconductor material layers;
    recessing at least a first of said semiconductor material layers relative to a second of said semiconductor material layers after removing said second sidewall spacer;
    removing said first sidewall spacer after recessing said at least said first of said semiconductor material layers; and
    forming said doped extension regions after removing said first sidewall spacer.

12. The method of claim 7, wherein forming said doped extension regions comprises forming said doped extension regions such that said semiconductor material layers have substantially the same dopant profile.

13. The method of claim 7, wherein forming said doped extension regions comprises doping said exposed portions of each of said patterned semiconductor material layers by performing a plasma doping process.

14. The method of claim 7, wherein said first sidewall spacer comprises a nitride and said second sidewall spacer comprises an oxide.

15. The method of claim 7, further comprising forming source and drain regions adjacent said first and second exposed end surfaces prior to forming said doped extension regions.

16. A method of forming a nanowire device, comprising:
    forming a plurality of semiconductor material layers above a semiconductor substrate;
    forming a gate structure above said plurality of semiconductor material layers;
    forming a first sidewall spacer adjacent to said gate structure;
    forming a second sidewall spacer adjacent to said first sidewall spacer;
    patterning said plurality of semiconductor material layers such that each layer has first and second exposed end surfaces, wherein said gate structure, said first sidewall spacer and said second sidewall spacer are used in combination as an etch mask during said patterning process;
    forming source and drain regions adjacent said first and second exposed end surfaces;
    removing said second sidewall spacer after forming said source and drain regions, thereby exposing at least a portion of said patterned semiconductor material layers;
    recessing at least a first of said semiconductor material layers relative to a second of said semiconductor material layers after removing said second sidewall spacer;
    removing said first sidewall spacer after recessing said at least said first of said semiconductor material layers; and
    after removing at least said second sidewall spacer, forming doped extension regions in exposed portions of each of said patterned semiconductor material layers.

17. The method of claim 16, wherein forming said doped extension regions comprises forming said doped extension regions such that said semiconductor material layers have substantially the same dopant profile.

18. The method of claim 16, wherein forming said doped extension regions comprises doping exposed portions of each of said patterned semiconductor material layers by performing a plasma doping process.

19. The method of claim 16, wherein said first sidewall spacer comprises a nitride and said second sidewall spacer comprises an oxide.

\* \* \* \* \*